(12) United States Patent
Forster et al.

(10) Patent No.: US 8,988,015 B2
(45) Date of Patent: Mar. 24, 2015

(54) POWER TOOL HAVING A NON-LINEAR TRIGGER-SPEED PROFILE

(75) Inventors: Michael K. Forster, White Hall, MD (US); Jason K. Leh, Rosedale, MD (US); Wing W. Lin, Bel Air, MD (US)

(73) Assignee: Black & Decker Inc., Newark, DE (US)

( * ) Notice: Subject to any disclaimer, the term of this patent is extended or adjusted under 35 U.S.C. 154(b) by 965 days.

(21) Appl. No.: 13/081,831

(22) Filed: Apr. 7, 2011

(65) Prior Publication Data
US 2011/0254472 A1 Oct. 20, 2011

Related U.S. Application Data

(60) Provisional application No. 61/321,699, filed on Apr. 7, 2010.

(51) Int. Cl.
*H02K 7/14* (2006.01)
*H02J 7/00* (2006.01)
*B25F 5/02* (2006.01)
*H01M 10/44* (2006.01)
*H02J 7/04* (2006.01)
(Continued)

(52) U.S. Cl.
CPC .............. *H02J 7/0003* (2013.01); *B25F 5/021* (2013.01); *H01M 10/441* (2013.01); *H02J 7/0008* (2013.01); *H02J 7/0019* (2013.01); *H02J 7/045* (2013.01); *H02P 7/29* (2013.01); *H01M 10/482* (2013.01); *G01R 31/3627* (2013.01); *H02J 7/0031* (2013.01); *H02J 7/0063* (2013.01); *H02J 7/0047* (2013.01); *H05B 33/0806* (2013.01); *H01H 9/061* (2013.01); *H01M 2010/4278* (2013.01); *H01M 2220/30* (2013.01); *G01R 31/362* (2013.01);
*H02J 2007/004* (2013.01); *H02J 2007/0067* (2013.01); *G01R 31/3682* (2013.01); *H01M 2010/4271* (2013.01)
USPC ................ 318/3; 318/599; 318/461; 318/466

(58) Field of Classification Search
USPC ............. 318/3, 599, 430, 461, 466, 467, 489; 388/907.5, 909, 916, 917
See application file for complete search history.

(56) References Cited

U.S. PATENT DOCUMENTS 3,988,656 A * 10/1976 Schnizler et al. ............. 388/830
5,440,215 A * 8/1995 Gilmore ........................ 318/432
(Continued)

FOREIGN PATENT DOCUMENTS

DE 3146339 A1 6/1983
DE 102007011658 A1 9/2008
(Continued)

OTHER PUBLICATIONS

Calculus With Analytic Geometry, Earl W. Swokowski, Jun. 1977.*

*Primary Examiner* — Bentsu Ro
*Assistant Examiner* — Thai Dinh
(74) *Attorney, Agent, or Firm* — Amir Rohani; Scott Markow

(57) ABSTRACT

A power tool including a motor, an input unit such as a variable-speed trigger switch, and a controller is provided. The controller controls the speed of the motor as a function of the input level indicated by the electrical signal from the input unit. The function is a first expression within a first predetermined range of the input level and a second expression within a second predetermined range of the input level, where the second expression corresponds to a polynomial of a second degree or higher and is different from the first expression.

16 Claims, 4 Drawing Sheets

(51) Int. Cl.
*H02P 7/29* (2006.01)
*H01M 10/48* (2006.01)
*G01R 31/36* (2006.01)
*H05B 33/08* (2006.01)
*H01H 9/06* (2006.01)
*H01M 10/42* (2006.01)

(56) References Cited

U.S. PATENT DOCUMENTS

| | | | |
|---|---|---|---|
| 5,449,215 A | 9/1995 | Viertel et al. | |
| 5,731,673 A | 3/1998 | Gilmore | |
| 5,732,870 A | 3/1998 | Moorman et al. | |
| 5,999,113 A | 12/1999 | Kirlyama | |
| 6,166,781 A | 12/2000 | Kwak et al. | |
| 6,392,373 B1 | 5/2002 | Glasgow et al. | |
| 6,424,799 B1 | 7/2002 | Gilmore | |
| 6,459,175 B1 | 10/2002 | Potega | |
| 6,719,174 B1 | 4/2004 | Swift | |
| 6,759,822 B2 | 7/2004 | Marusarz | |
| 6,823,134 B2 | 11/2004 | Glasgow et al. | |
| 6,836,614 B2 | 12/2004 | Gilmore | |
| 6,873,124 B2 * | 3/2005 | Kawano et al. | 318/244 |
| 6,900,747 B2 | 5/2005 | Lee | |
| 6,950,841 B2 | 9/2005 | Challa et al. | |
| 6,971,454 B2 | 12/2005 | Bogue | |
| 7,002,265 B2 | 2/2006 | Potega | |
| 7,038,437 B2 | 5/2006 | Kenny et al. | |
| 7,085,792 B2 | 8/2006 | Wei et al. | |
| 7,112,934 B2 * | 9/2006 | Gilmore | 318/432 |
| 7,116,071 B2 | 10/2006 | Glasgow et al. | |
| 7,282,880 B2 | 10/2007 | Glasgow et al. | |
| 7,400,106 B2 | 7/2008 | DeCicco et al. | |
| 7,420,341 B2 * | 9/2008 | Glasgow et al. | 318/280 |
| 7,481,627 B2 | 1/2009 | Beckman | |
| 7,487,844 B2 | 2/2009 | DeCicco et al. | |
| 7,489,856 B2 | 2/2009 | Haller | |
| 7,503,467 B1 | 3/2009 | Swift | |
| 7,821,217 B2 * | 10/2010 | Abolhassani et al. | 318/432 |
| 8,067,913 B2 * | 11/2011 | Watabe et al. | 318/446 |
| 8,179,069 B2 * | 5/2012 | Matsunaga et al. | 318/434 |
| 8,461,785 B2 * | 6/2013 | Sidhu | 318/257 |
| 8,552,669 B2 * | 10/2013 | Kusakawa | 318/139 |
| 2006/0060366 A1 | 3/2006 | Bodine et al. | |
| 2006/0087283 A1 | 4/2006 | Phillips et al. | |
| 2006/0087284 A1 | 4/2006 | Phillips et al. | |
| 2006/0087285 A1 | 4/2006 | Phillips et al. | |
| 2006/0087286 A1 | 4/2006 | Phillips et al. | |
| 2006/0150132 A1 | 7/2006 | Gupta | |
| 2007/0144310 A1 | 6/2007 | Pozgay et al. | |
| 2007/0144752 A1 | 6/2007 | Pozgay et al. | |
| 2007/0144872 A1 | 6/2007 | DeCicco et al. | |
| 2007/0267990 A1 | 11/2007 | Abolhassani et al. | |
| 2008/0238370 A1 | 10/2008 | Carrier et al. | |
| 2008/0249551 A1 | 10/2008 | Sunaoshi et al. | |
| 2008/0262654 A1 | 10/2008 | Omori et al. | |
| 2008/0298784 A1 | 12/2008 | Kastner et al. | |
| 2009/0036901 A1 | 2/2009 | Omori | |
| 2009/0062814 A1 | 3/2009 | Omori et al. | |
| 2009/0071671 A1 | 3/2009 | Zhong et al. | |
| 2009/0071673 A1 | 3/2009 | Zhong et al. | |
| 2009/0148139 A1 | 6/2009 | DeCicco et al. | |
| 2009/0292520 A1 | 11/2009 | Nwankpa et al. | |

FOREIGN PATENT DOCUMENTS

| | | |
|---|---|---|
| EP | 0617505 B1 | 11/1996 |
| EP | 0877473 B1 | 1/2005 |
| EP | 1512495 A2 | 3/2005 |
| EP | 1592033 A1 | 11/2005 |
| EP | 1425770 B1 | 2/2006 |
| WO | 9612591 A1 | 5/1996 |
| WO | 2008083667 A2 | 7/2008 |

* cited by examiner

POWER TOOL HAVING A NON-LINEAR TRIGGER-SPEED PROFILE

CROSS-REFERENCE TO RELATED APPLICATIONS

This application claims the benefit of U.S. Provisional Application No. 61/321,699 filed on Apr. 7, 2010. The disclosure of the above application is incorporated herein by reference.

FIELD

The present disclosure relates to a power tool and more particularly a power tool having a variable-speed input unit.

BACKGROUND

In a power tool having a variable-speed trigger, linear trigger position v. motor speed profiles have been conventionally used. Use of linear profiles is problematic because it provides the user with the same level of control throughout the range of the trigger position. For this reason, it is desirable to provide a more flexible trigger profile in a power tool.

SUMMARY

According to an aspect of the invention, a power tool is provided comprising a motor, an input unit actuated by a user, and a control unit configured to receive an electrical signal from the input unit and control the speed of the motor as a function of an input level indicated by the electrical signal from the input unit. The function is a first expression within a first predetermined range of the input level and a second expression within a second predetermined range of the input level, where the second expression corresponds to a polynomial of a second degree or higher and is different from the first expression.

According to an embodiment, the input unit is at least one of a variable-speed trigger, a speed dial, an optical sensor, a pressure sensor, a capacitor sensor, or a touch sensor. The variable-speed trigger may include a potentiometer. In an embodiment, the control unit is configured to receive a voltage from the input device, such as the variable-speed trigger switch, where the voltage corresponds to the trigger switch position. The control unit controls the speed of the motor as a function of the received voltage.

According to an embodiment, in DC applications, the control unit is configured to determine a range of the input level and calculate a pulse-width modulation (PWM) duty cycle using the first or the second expressions based on the determined range of the input level. Alternatively, the control unit may be configured to calculate a pulse-width modulation (PWM) duty cycle using the second expression and adjust the PWM duty cycle using the first expression if the calculated PWM duty cycle corresponds to the first predetermined range of the input level.

According to an embodiment, where the motor is coupled to an AC power line, the control may be configured to determine a range of the input level and calculate a firing angle corresponding to a phase angle of the AC power line using the first or the second expressions based on the determined range of the input level. Alternatively, the control unit may be configured to determine a firing angle corresponding to a phase angle of the AC power line using the second expression and adjust the firing angle using the first expression if the calculated firing angle corresponds to the first predetermined ranged of the input level.

According to an embodiment, the function may further correspond to a third expression within a third predetermined range of the input level different from the first and the second predetermined ranges, the first and third expressions corresponding to constant or linear functions and the second expression corresponding to a non-linear function. For example, the control unit may be configured to set a pulse-width modulation (PWM) duty cycle to 0% if the calculated PWM duty cycle corresponds to the second predetermined range and to 100% if the PWM duty cycle corresponds to the third predetermined range.

According to an embodiment, an input level v. motor power profile representing the first and second expressions is non-continuous between the first and the second zones.

According to an aspect of the invention, a method of controlling speed of a motor within a power tool having an input unit is provided. The method comprises: receiving a signal from the input unit indicative of an input level; and controlling the speed of the motor as a function of the input level, the function being a first expression within a first predetermined range of the input level and a second expression within a second predetermined range of the input level, where the second expression corresponds to a polynomial of a second degree or higher and is different from the first expression.

According to an embodiment, the controlling step comprises determining a range of the input level and calculating a pulse-width modulation (PWM) duty cycle using the first or the second expressions based on the determined range of the input level. Alternatively, the controlling step may comprise calculating a pulse-width modulation (PWM) duty cycle using the second expression and adjusting the PWM duty cycle using the first expression if the calculated PWM duty cycle corresponds to the first predetermined range of the input level.

According to an embodiment, where the motor is coupled to an AC power line, the controlling step comprises determining a range of the input level and calculating a firing angle corresponding to a phase angle of the AC power line using the first or the second expressions based on the determined range of the input level. Alternatively, the controlling step may comprise determining a firing angle corresponding to a phase angle of the AC power line using the second expression and adjusting the firing angle using the first expression if the calculated firing angle corresponds to the first predetermined ranged of the input level.

DRAWINGS

Figure 3:
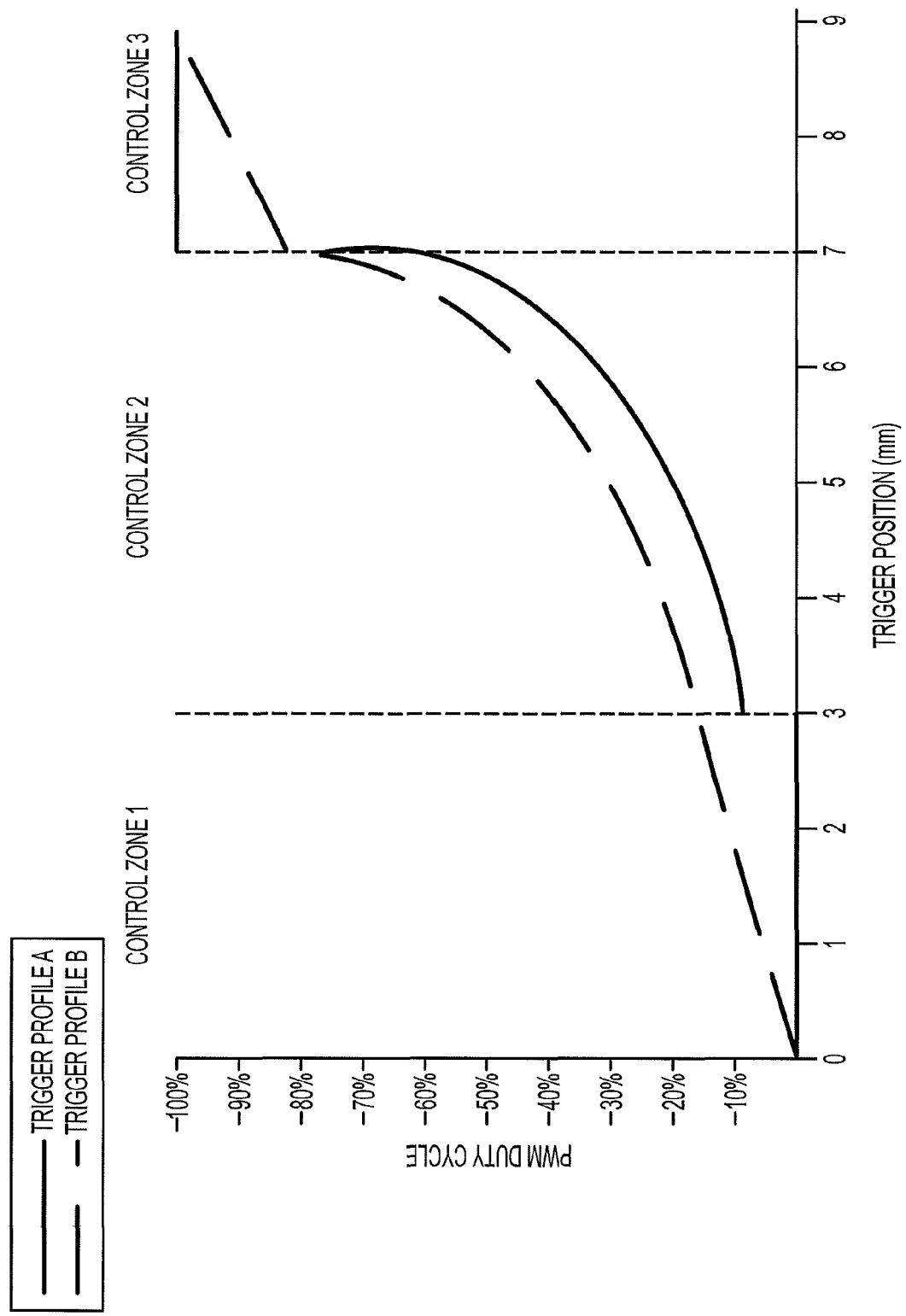
Figure 4:
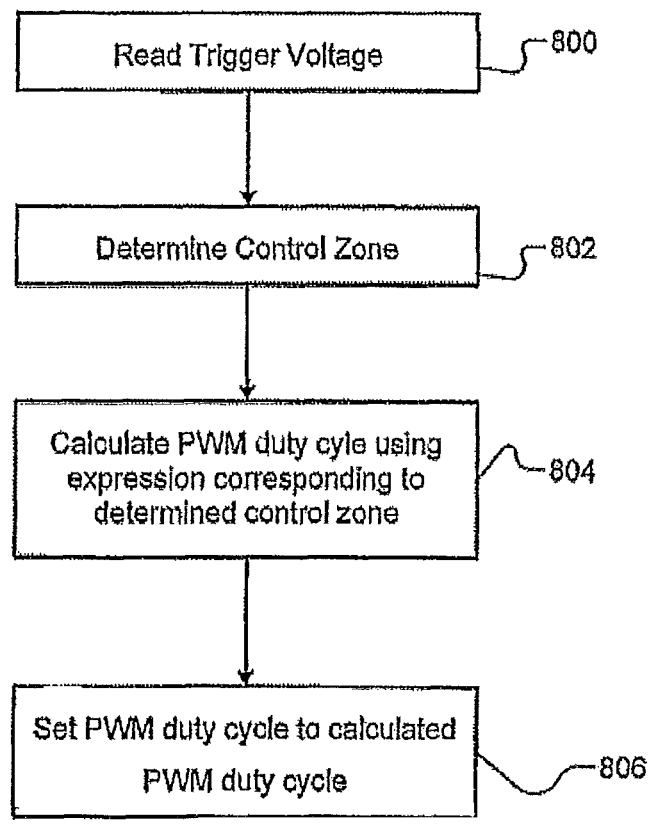

FIG. 3 is a graph illustrating the concept of control zones for a trigger switch profile; and FIG. 4 is a flow diagram illustrating an exemplary method for determining a PWM duty cycle using a trigger switch profile that includes control zones; and The drawings described herein are for illustrative purposes only of selected embodiments and not all possible implementations, and are not intended to limit the scope of the present disclosure. Further areas of applicability will become apparent from the description provided herein. The description and specific examples in this summary are intended for purposes of illustration only and are not intended to limit the scope of

DETAILED DESCRIPTION

Figure 1:
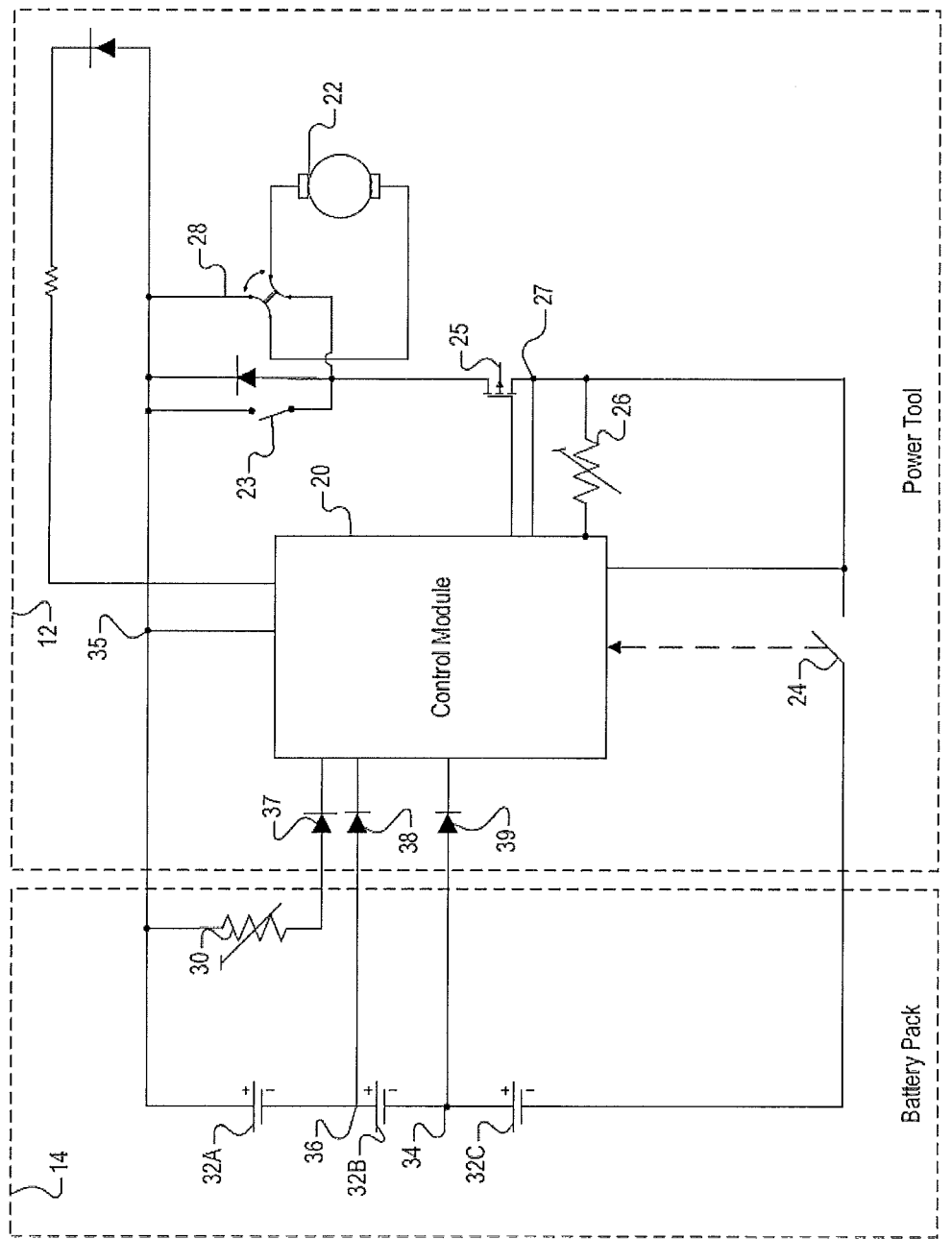
FIG. 1 is a schematic illustrating an exemplary embodiment of a power tool.

FIG. 1 depicts an exemplary embodiment of a basic schematic of a power tool assembly. The power tool assembly is comprised of a combination of a power tool 12 and a battery pack 14. The battery pack 14 may be removably coupled or permanently coupled to the power tool 12. The battery pack 14 comprises three battery cells, 32A, 32B and 32C. Alternate embodiments may comprise more or less battery cells. In this embodiment, the discharge control functionality is located in the power tool 12 which reduces the cost of the battery pack. The battery pack 14 may be coupled to the power tool 12 via cell tabs (Not shown in Figure). Other means of coupling the battery pack 14 to the power assembly are also envisioned.

The power tool assembly may be comprised of a tool instrument (not shown) which is driven by a motor 22. The motor 22 is controlled by a discharge control module 20. The discharge control module 20 monitors various conditions of the power tool assembly and the battery pack and controls the power output to the motor accordingly.

In FIG. 1, the discharge control module 20 is located in the power tool 12, as opposed to the battery pack 14. This configuration, although not required, decreases the cost of a lithium ion battery pack, as well as allows for different tools to use the same type of battery pack. The discharge control module 20 controls the power being delivered to the motor 22, which drives the power tool instrument (not shown). When the operator engages a switch 24, a gate of a FET 25 is biased with a power signal, which closes the circuit so power is delivered to the motor 22. For explanatory purposes, the switch is hereinafter referred to as a trigger switch 24, but it is understood that the switch 24 may be other types of switches. When a cutoff condition exists, e.g. the battery temperature increases above a temperature cutoff threshold, the discharge control module 20 cuts the power signal at the FET 25, thereby opening the circuit and depriving the motor 22 of power.

When an operator disengages the trigger switch 24, the discharge control module 20 can shut off the motor 22 by, for example, closing a brake switch 23 thereby shorting the motor. In some embodiments, the brake switch 23 is mechanically coupled to the variable speed trigger switch 24 so that once the switch is opened, the brake switch is closed, which shorts the motor 22.

The discharge control module 20 monitors the voltage of the battery pack by monitoring the voltage at node 35. Further a split cell voltage may be monitored at nodes 34 or 36. Extending from nodes 34 and 36 are cell taps extending from each node. A cell tap is a wire or other connection that couples the nodes 34 and 36 to the discharge control module 20.

To monitor the battery pack 14 temperature, a temperature sensor 30 is used. One example of a temperature sensor is a thermistor, which is a cost effective yet dependable means of monitoring the temperature in a circuit. It is envisioned, however, that other types of temperature sensors may also be used, e.g. thermometer or thermocouple. The temperature sensor 30 provides a reading of the battery pack temperature to the discharge control module 20. A second temperature sensor 26 is used to measure the temperature of the power tool 12. Similar to the first temperature sensor, a thermistor, thermometer, or a thermocouple may be used to measure the temperature.

As shown in FIG. 1, the voltage of the battery pack 14 can be measured by discharge control module 20 at, for example, node 35. The voltage is read by the discharge control module 20 so that the voltage of the battery cells can be monitored. Once the battery pack reaches a cutoff voltage, e.g. 10V, the discharge control module 20 cuts power to the motor 22 by turning the FET 25 off.

The motor 22 is controlled by an operator via a variable speed trigger switch 24, which when engaged by the user, closes a switch coupled to the variable speed trigger switch 24. The variable speed trigger switch 24 may be pressed in by the operator using various pressures and the rotational speed of the motor 22 corresponds to the total distance traveled by the variable speed trigger switch 24.

In power tools where a reverse operation is preferred, e.g. a screwdriver or drill, the power tool 12 further includes a 2 point double-pole-double-throw (DPDT) switch 28, whereby the polarity of the circuit is reversed by throwing the DPDT switch 28. As may be appreciated, the power tool operator may manually push a button or switch on the exterior of the power tool to cause the motor 22 to operate in reverse. When the operator manually pushes the reverse button or switch, the DPDT switch 28 is thrown and the motor 22 will rotate in the opposite direction.

Furthermore, the power tool assembly may include an LED (Not shown). The LED may be lit when the power tool is in operation. The LED may be coupled to the discharge control module 20, so that the LED is provided with power when the variable trigger switch 24 is engaged by a user.

While the foregoing describes some embodiments of the power tool 12, as well as the battery pack 14 coupled thereto, it is envisioned that other configurations can be implemented in the design of the power tool 12 and battery pack 14. Further, it is appreciated that the aspects of the invention discussed below may be applied to a wide variety of platforms and are not solely limited to the configuration described above.

One means for delivering power to the motor is by performing pulse width modulation (PWM) on the voltage signal to achieve a power signal having a PWM duty cycle. Pulse width modulation is a means of delivering intermediate amounts of power between ON and OFF. Pulse width modulation can be achieved by modeling the power signal as a rectangular pulse wave that is modulated thereby resulting in the variation of the average value of the waveform. The percentage of full power that is being delivered is referred to as the PWM duty cycle. The duty cycle corresponds to the average value of the waveform. Thus, a duty cycle of 80% corresponds to an 80% power output, which is obtained by having the power ON for 80% of the cycle and OFF for 20% of the cycle. This can be achieved by having the FET 25 closed 80% of the time and open the remaining 20% of the time. Thus, by controlling the value of the PWM duty cycle various power outputs can be achieved.

While embodiments of this application are herein discussed with reference to PWM duty cycle control, it should be understood that similar concepts may be applied to other methods of controlling motor power. For example, the concepts discussed herein may be used to determine a firing angle in a phase-controlled AC motor.

According to an aspect of the disclosure, a non-linear trigger switch profile is provided. As discussed above and shown in FIG. 1, the power tool assembly includes a variable speed trigger switch 24, in certain embodiments. A variable speed trigger switch 24 allows the tool operator to control the tool speed by pulling the trigger switch 24 to various positions, such that when the trigger switch 24 is fully pulled, the maximum tool speed may be realized and that variable speeds may be realized at other positions of the trigger switch.

Current variable speed trigger switches have a basic linear trigger switch profile where the tool speed is linearly proportional to the travel distance of the trigger switch. This characteristic, however, may not be optimal for tool operators as the variable speed trigger switch functionality is most convenient when the operator wants the tool to rotate at much lower speeds than the maximum speed. A linear relationship between the trigger switch position and the tool speed, however, results in only a small portion of the total travel distances of the trigger switch resulting in the low tool speeds, and an equal amount of travel distance resulting in high and almost full tool speeds. Thus, a nonlinear trigger switch profile is herein disclosed as an alternative embodiment of the variable speed trigger switch.

The variable speed trigger switch 24 characteristics may be defined by a trigger switch potentiometer/wiper system that couple to the discharge control module 20. While the variable speed trigger switch is described by a trigger switch potentiometer/wiper configuration, it is envisioned that the variable speed trigger switch 24 may be configured by other means of relating the trigger switch position to a voltage reading, e.g. a magnet plus Hall effect sensor. Furthermore, the rotational speed of the motor 22 is ultimately a function of the trigger switch position. Thus, it is envisioned that any sensor that may provide an output indicative of the trigger switch position and that can communicate the output to the discharge control module 20 can be used. For explanatory purpose, however, a potentiometer/wiper system is assumed, such that the voltage read by the discharge control module 20 indicates the distance the variable speed trigger switch 24 traveled as a result of the operator pressing the trigger switch.

It should be understood that while embodiments of this application are discussed with reference to the variable speed trigger switch 24, other input devices such as variable speed dials, touch sensors, optical pressure sensors, capacitor sensors, etc. may also be utilized with the concepts disclosed herein. For example, a voltage signal indicative of the pressure level applied to a touch sensor may be used in conjunction with the concepts described herein to create a non-linear profile.

As mentioned, the discharge control module 20 will receive a voltage from the variable speed trigger switch 24 such that the voltage received is indicative of the trigger switch position. The discharge control module 20 will then calculate the PWM duty cycle using a predefined equation, such that the PWM duty cycle is a function of the voltage/trigger switch position. Thus, the discharge control module 20 sets the PWM duty cycle according to the following expression:

$$\text{CalculatedPWM} = f(\text{ADC\_Wiper}) \tag{6}$$

such that f(ADC_Wiper) can be defined as any non-first order expression and wherein ADC_Wiper is a value indicative of the voltage corresponding of the trigger switch position. Thus, f(ADC_Wiper) may be expressed by a polynomial equation (7) as follows:

$$f(\text{ADC\_Wiper}) = i_n(\text{ADC\_Wiper})^n + i_{n-1}(\text{ADC\_Wiper})^{n-1} + \ldots i_1(\text{ADC\_Wiper}) + c \tag{7}$$

where i is a coefficient representing the polynomial gain, n is the exponent representing the degree of the polynomial, c is the constant, and at least one of $i_n, i_{n-1} \ldots i_2$ does not equal 0. In other words, the polynomial is at least of the second degree. Furthermore, it is appreciated that the maximum value of the calculated PWM duty cycle should not exceed 100%. Accordingly, the value of ADC_Wiper may need to be adjusted from the raw voltage measurements received from the trigger switch if the raw voltages are greater than one.

In an exemplary embodiment, wherein a polynomial of the second degree is desired to achieve a curvature, the PWM duty cycle of the power signal may be calculated according to following:

$$\text{CalculatedPWM} = \left( \frac{\left(\frac{\text{ADC\_Wiper}}{8}\right)^2}{128} + \text{PWM\_Offset} \right) \times \frac{\text{PWM\_Multiplier}}{256} \tag{8}$$

where PWM_Offset corresponds to the constant c in the polynomial expression (7) above and may be used to define the trigger switch position at which the motor begins to rotate. PWM_Multipler corresponds to the polynomial coefficient $i_2$ in the polynomial expression (7) above is used to define the concavity of the trigger switch profile.

PWM_Offset may be selected by choosing the ADC_Wiper voltage corresponding to the desired start position of the trigger switch 24, e.g. 2 or 3 mm, and solving the following equation:

$$\text{PWM\_Offset} = -\frac{\left(\frac{\text{ADC\_Wiper\_Start}}{8}\right)^2}{128} \tag{9}$$

where ADC_Wiper_Start is the desired wiper voltage at which the motor begins to receive power. It is noted that the specific denominator values provided in equations (8) and (9) are optionally selected so that the calculated PWM duty cycle be represented as a 7-bit binary number. These values are not intended to be limiting and are provided for exemplary purposes only.

Additionally, it is envisioned that the calculated PWM can be calculated using a logarithmic expression, a step function, or any other type of equation other than a polynomial. Furthermore, as previously discussed, the term ADC_Wiper is used to signify the voltage reading from a potentiometer/wiper system. It is reiterated that any reading indicating the trigger switch position may be used in accordance with the examples provided above.

Figure 2:
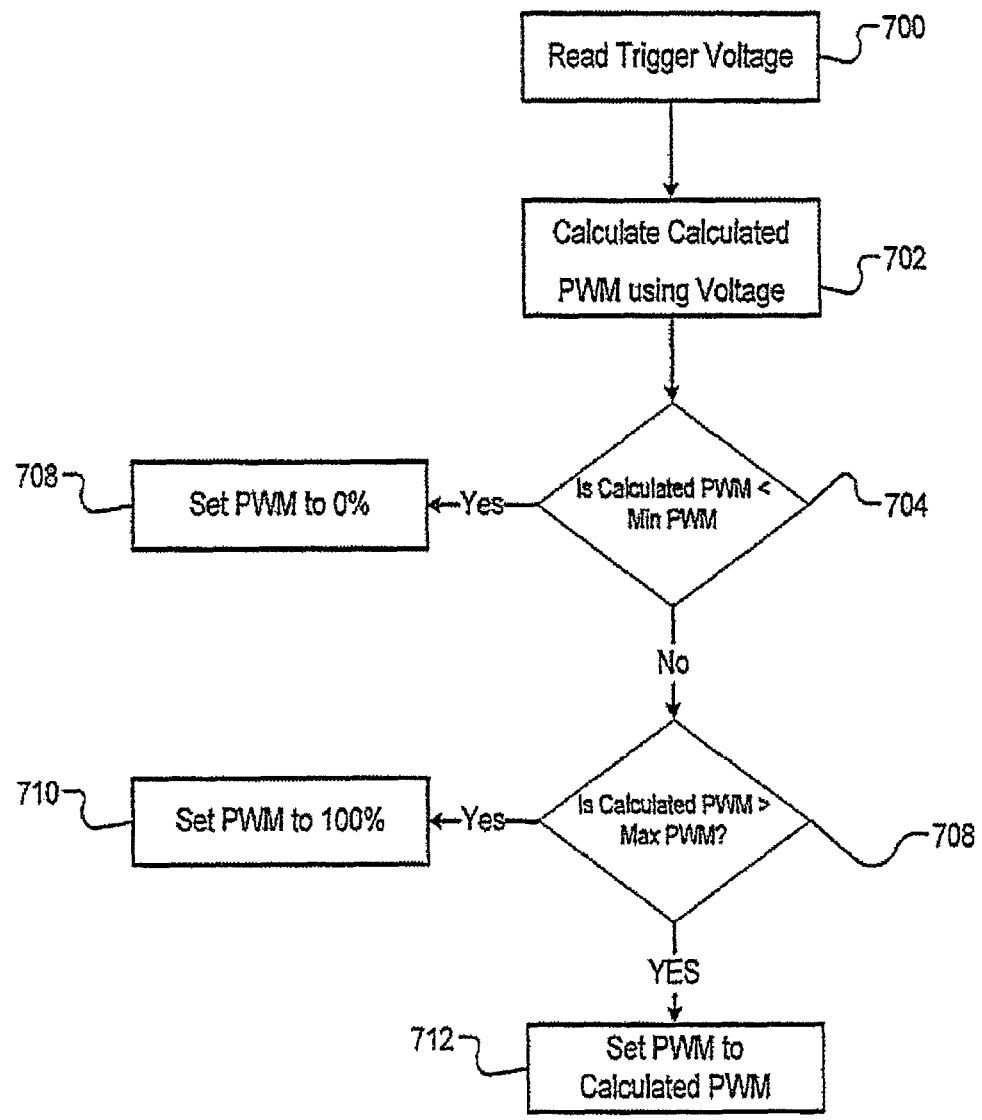
FIG. 2 is a flow diagram illustrating an exemplary method calculating a non-linear trigger switch profile.

Using the foregoing, the PWM duty cycle of the power signal may be calculated according to the method depicted in FIG. 2. The method in FIG. 2 is used to ensure that the PWM duty cycle is not too low, e.g. too close to 0%, or not too high, e.g. too close to 100%. At step 700 the voltage is read, which is indicative of the trigger switch position. At step 702, the PWM duty cycle is calculated as a function of the read voltage using the techniques described above. At step 704 the calculated PWM duty cycle is compared to a minimum duty cycle threshold. If the PWM duty cycle is less than the minimum duty cycle threshold, then the PWM duty cycle is set to 0%. If the calculated PWM duty cycle is greater than or equal to the minimum duty cycle threshold, the method proceeds to step 708, where the calculated PWM duty cycle is compared to a maximum duty cycle threshold. If the calculated PWM duty cycle is greater than the maximum duty cycle threshold, the PWM duty cycle is set to 100% at step 710. If the calculated cycle is less than or equal to the maximum duty cycle threshold, then the PWM duty cycle is set to the calculated PWM duty cycle at step 712.

In some embodiments, the trigger switch profile is further broken down into a plurality of control zones, where the trigger switch profile in each zone differs from the trigger switch profiles of the other zones. For example, the PWM duty cycle may be set to 0% when the trigger switch position is less than or equal to a first predetermined threshold, set to the result of the PWM duty cycle equation when it is greater than the first predetermined threshold and less than or equal to a second predetermined threshold, and set to 100% when it is greater than the second predetermined threshold. It is envisioned, that in other embodiments, the equations for calculating the PWM duty cycle of the power signal varies from zone to zone. Furthermore, in some zones the PWM duty cycle can have a linear relationship with the trigger switch position, while in other zones the PWM duty cycle may have a non-linear relationship with the trigger switch position. In a further embodiment, the PWM duty cycle may be calculated using different polynomial expressions of different degrees or different gains within different zones.

FIG. 3 is a graph depicting hypothetical relationships between trigger switch position and PWM duty cycle, wherein the PWM duty cycle is a function of the trigger switch position. As can be seen in the Figure, the graph is broken down into three control zones. Depending on the trigger switch position, i.e. which control zone the trigger switch position corresponds to, the PWM duty cycle is set according to an expression corresponding to the control zone. The following table depicts an exemplary relationship between the control zones, trigger switch position, and the expression used to calculate the PWM duty cycle:

Trigger_profile:
$$\begin{cases} \text{Control\_Zone\_1} & 0 \text{ mm} \le x < 3 \text{ mm} & PWM = \text{Expression\_1} \\ \text{Control\_Zone\_2} & 3 \text{ mm} \le x < 7 \text{ mm} & PWM = \text{Expression\_2} \\ \text{Control\_Zone\_3} & 7 \text{ mm} \le x & PWM = \text{Expression\_3} \end{cases}$$

The thresholds 3 mm and 7 mm are not required and are shown merely as an example. Also, these values may be presented as percentages of the total trigger pull range rather than specific distances. Furthermore, while the value x represents the physical trigger switch position, it is appreciated that this value x may actually represent a voltage reading corresponding to the trigger switch position and the thresholds may be defined as threshold voltage values. It is envisioned that the thresholds may be adjusted based on the type of tool, the variable trigger switch assembly and the desired responsiveness.

In the graph of FIG. 3 there are two lines representing the calculated PWM duty cycle based on trigger switch profile A and trigger switch profile B. In trigger switch profile A, in the control zone 1, the PWM duty cycle is 0%, in control zone 2, the PWM duty cycle has a $2^{nd}$ order relationship with the PWM duty cycle, and in the third control zone, the PWM duty cycle jumps to 100%. As can be seen, once the tool operator pulls the trigger switch to 7 mm, the tool will operate at a 100% PWM duty cycle.

Observing trigger switch profile B, it can be seen that the relationship between the trigger switch position and the PWM duty cycle is a first linear relationship in control zone 1, a $2^{nd}$ order relationship in control zone 2, and a second linear relationship in control zone 3. It is envisioned that the number of control zones does not need to be 3 and in some embodiments there may be only one control zone.

In accordance with the examples provided in FIG. 3, the PWM duty cycle can be set according to the method of FIG. 4. At step 800, the voltage is read indicating a position of the trigger switch. At step 802, a control zone is determined which corresponds to the read voltage/trigger switch position. At step 804, the PWM duty cycle is calculated or set according to the expression corresponding to the determined control zone.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A power tool comprising:
a motor;
an input unit actuated by a user; and
a control unit configured to receive a voltage signal from the input unit corresponding to a position of the input unit and control the speed of the motor as a function of the voltage signal from the input unit, the function being a first expression within a first predetermined range of the input level and a second expression within a second predetermined range of the input level, wherein the second expression corresponds to a polynomial of a second degree or higher and is different from the first expression, and the second expression is offset by a predetermined voltage amount corresponding to a constant in the polynomial expression defining the position of the input unit at which the motor begins to rotate.

2. The power tool of claim 1, wherein the input unit comprises at least one of a variable-speed trigger, a speed dial, an optical sensor, a pressure sensor, a capacitor sensor, or a touch sensor.

3. The power tool of claim 2, wherein the input unit comprises a variable-speed trigger having a potentiometer and the control unit is configured to receive the voltage signal from the variable-speed trigger switch corresponding to the trigger switch position and to control the speed of the motor as a function of the received voltage.

4. The power tool of claim 1, wherein the control unit is configured to determine a range of the input level and calculate a pulse-width modulation (PWM) duty cycle using the first or the second expressions based on the determined range of the input level.

5. The power tool of claim 1, wherein the control unit is configured to calculate a pulse-width modulation (PWM) duty cycle using the second expression and adjust the PWM duty cycle using the first expression if the calculated PWM duty cycle corresponds to the first predetermined range of the input level.

6. The power tool of claim 1, wherein the function further corresponds to a third expression within a third predetermined range of the input level different from the first and the second predetermined ranges, the first and third expressions corresponding to constant or linear functions and the second expression corresponding to a non-linear function.

7. The power tool of claim 6, wherein the control unit is configured to set a pulse-width modulation (PWM) duty cycle to 0% if the calculated PWM duty cycle corresponds to the first predetermined range and to 100% if the PWM duty cycle corresponds to the third predetermined range.

8. The power tool of claim 1, wherein the predetermined voltage offset amount is optimized so that an input level v. motor power profile representing the first and second expressions is non-continuous between the first predetermined range of the input level and the second predetermined range of the input level.

9. The power tool of claim 1, wherein the predetermined voltage offset amount is optimized so that an input level v. motor voltage profile representing the first and second expressions is non-continuous between the first predetermined range of the input level and the second predetermined range of the input level.

10. A method of controlling speed of a motor within a power tool having an input unit, comprising:
receiving a voltage signal from the input unit indicative of a position of the input unit; and
controlling the speed of the motor as a function of the voltage signal, the function being a first expression within a first predetermined range of the input level and a second expression within a second predetermined range of the input level, wherein the second expression corresponds to a polynomial of a second degree or higher and is different from the first expression, and the second expression is offset by a predetermined voltage amount corresponding to a constant in the polynomial expression defining the position of the input unit at which the motor begins to rotate.

11. The method of claim 10, wherein the receiving step comprises receiving the signal from at least one of a variable-speed trigger, a speed dial, an optical sensor, a pressure sensor, a capacitor sensor, or a touch sensor.

12. The method of claim 11, wherein the input unit comprises a variable-speed trigger having a potentiometer, the receiving step comprises inputting the voltage signal from the variable-speed trigger switch corresponding to the trigger switch position and the controlling step comprises controlling the speed of the motor as a function of the received voltage.

13. The method of claim 10, wherein the controlling step comprises determining a range of the input level and calculating a pulse-width modulation (PWM) duty cycle using the first or the second expressions based on the determined range of the input level.

14. The method of claim 10, wherein the controlling step comprises calculating a pulse-width modulation (PWM) duty cycle using the second expression and adjusting the PWM duty cycle using the first expression if the calculated PWM duty cycle corresponds to the first predetermined range of the input level.

15. The method of claim 10, wherein the function further corresponds to a third expression within a third predetermined range of the input level different from the first and the second predetermined ranges, the first and third expressions corresponding to constant or linear functions and the second expression corresponding to a non-linear function.

16. The method of claim 15, wherein the controlling step further comprises setting a pulse-width modulation (PWM) duty cycle to 0% if the calculated PWM duty cycle corresponds to the first predetermined range and to 100% if the PWM duty cycle corresponds to the third predetermined range.

* * * * *